(12) United States Patent
Payne et al.

(10) Patent No.: US 8,974,855 B2
(45) Date of Patent: Mar. 10, 2015

(54) MANGANITE PEROVSKITE CERAMICS, THEIR PRECURSORS AND METHODS FOR FORMING

(75) Inventors: David Alan Payne, Champaign, IL (US); Brent Allen Clothier, Niskayuna, NY (US)

(73) Assignee: The United States Department of Energy, Washington, DC (US)

( * ) Notice: Subject to any disclaimer, the term of this patent is extended or adjusted under 35 U.S.C. 154(b) by 2034 days.

(21) Appl. No.: 11/198,676

(22) Filed: Aug. 5, 2005

(65) Prior Publication Data

US 2007/0031312 A1    Feb. 8, 2007

(51) Int. Cl.
| | |
|---|---|
| *B05D 5/00* | (2006.01) |
| *C01G 45/12* | (2006.01) |
| *C04B 35/01* | (2006.01) |
| *C04B 35/624* | (2006.01) |
| *C04B 35/626* | (2006.01) |

(Continued)

(52) U.S. Cl.
CPC ......... *C01G 45/1264* (2013.01); *C01P 2002/34* (2013.01); *C01P 2006/40* (2013.01); *C04B 35/016* (2013.01); *C04B 35/624* (2013.01); *C04B 35/6264* (2013.01); *C04B 2235/3208* (2013.01); *C04B 2235/3213* (2013.01); *C04B 2235/3215* (2013.01); *C04B 2235/3224* (2013.01); *C04B 2235/3225* (2013.01); *C04B 2235/3227* (2013.01); *C04B 2235/3229* (2013.01); *C04B 2235/3284* (2013.01); *C04B 2235/3296* (2013.01); *C04B 2235/441* (2013.01); *C04B 2235/6562* (2013.01); *C04B 2235/768* (2013.01); *C23C 18/1208* (2013.01); *C23C 18/1254* (2013.01); *C23C 18/1275* (2013.01); *C23C 18/1283* (2013.01); *H01L 43/12* (2013.01)
USPC ........................................................ 427/226

(58) Field of Classification Search
USPC ........................................................ 427/212
See application file for complete search history.

(56) References Cited

U.S. PATENT DOCUMENTS

| | | | | |
|---|---|---|---|---|
| 4,369,198 | A | * | 1/1983 | Uchi et al. ..................... 426/271 |
| 4,696,885 | A | | 9/1987 | Vijan |
| 4,898,842 | A | * | 2/1990 | David ............................... 501/9 |

(Continued)

OTHER PUBLICATIONS

Jung et al., "Patterning of Rare-Earth Manganate Thin Layer Using Self-Assembled Organic Thin-Film Templates," Bull. Korean Chem. Soc., 20, No. 7, pp. 824-27 (1999).*

(Continued)

*Primary Examiner* — Robert Vetere
(74) *Attorney, Agent, or Firm* — Jacob A. Heafner; Brian J. Lally; John T. Lucas

(57) ABSTRACT

Disclosed are a variety of ceramics having the formula $Ln_{1-x}M_xMnO_3$, where $0 \leq x \leq 1$ and where Ln is La, Ce, Pr, Nd, Pm, Sm, Eu, Gd, Tb, Dy, Ho, Er, Tm, Yb, Lu or Y; M is Ca, Sr, Ba, Cd, or Pb; manganite precursors for preparing the ceramics; a method for preparing the precursors; and a method for transforming the precursors into uniform, defect-free ceramics having magnetoresistance properties. The manganite precursors contain a sol and are derived from the metal alkoxides: $Ln(OR)_3$, $M(OR)_2$ and $Mn(OR)_2$, where R is $C_2$ to $C_6$ alkyl or $C_3$ to $C_9$ alkoxyalkyl, or $C_6$ to $C_9$ aryl. The preferred ceramics are films prepared by a spin coating method and are particularly suited for incorporation into a device such as an integrated circuit device.

20 Claims, 4 Drawing Sheets

(51) Int. Cl.
*C23C 18/12* (2006.01)
*H01L 43/12* (2006.01)

(56) References Cited

U.S. PATENT DOCUMENTS

| | | | |
|---|---|---|---|
| 5,112,676 A * | 5/1992 | Cot et al. | 427/226 |
| 5,128,316 A | 7/1992 | Agostinelli et al. | |
| 5,198,269 A * | 3/1993 | Swartz et al. | 427/226 |
| 5,217,754 A | 6/1993 | Santiago-Aviles et al. | |
| 5,271,955 A * | 12/1993 | Maniar | 438/3 |
| 5,391,393 A | 2/1995 | Maniar | |
| 5,427,734 A * | 6/1995 | Yamashita et al. | 419/23 |
| 5,439,624 A * | 8/1995 | Anderson et al. | 501/80 |
| 5,453,330 A | 9/1995 | Kawasaki et al. | |
| 5,462,009 A | 10/1995 | Garrigus | |
| 5,776,788 A * | 7/1998 | Aoki et al. | 438/396 |
| 5,871,579 A | 2/1999 | Liang et al. | |
| 5,894,064 A | 4/1999 | Hampden-Smith et al. | |
| 5,925,183 A | 7/1999 | Kato et al. | |
| 5,977,017 A | 11/1999 | Golden | |
| 6,066,581 A | 5/2000 | Chivukula et al. | |
| 6,231,666 B1 | 5/2001 | Clem et al. | |
| 6,337,032 B1 | 1/2002 | Chivukula et al. | |
| 6,372,686 B1 | 4/2002 | Golden | |
| 6,444,609 B1 * | 9/2002 | Golovin | 502/324 |
| 6,515,957 B1 | 2/2003 | Newns et al. | |
| 6,521,202 B1 | 2/2003 | Vaughey et al. | |
| 6,528,863 B1 | 3/2003 | Klee et al. | |
| 6,531,425 B2 | 3/2003 | Golden | |
| 6,664,117 B2 | 12/2003 | Zhuang et al. | |
| 6,673,691 B2 | 1/2004 | Zhuang et al. | |
| 6,676,749 B2 | 1/2004 | Era | |
| 6,824,814 B2 | 11/2004 | Zhuang et al. | |
| 7,030,435 B2 * | 4/2006 | Gnadinger | 257/295 |
| 7,456,127 B2 * | 11/2008 | Annis et al. | 502/171 |
| 2003/0148545 A1 | 8/2003 | Zhuang et al. | |
| 2003/0148546 A1 | 8/2003 | Zhuang et al. | |
| 2006/0155376 A1 * | 7/2006 | Asgari | 623/16.11 |

OTHER PUBLICATIONS

Manganese (II) Alkoxides[1]) by B. Horvath, R. Moseler, and E.G. Horvath; Z. anorg. allg. Chem. 449, 41-51 (1979).
Synthesis of cadmium tangstate films via sol-gel processing by Kirk Lennstrom, Steven J. Limmer, Guozhong Cao; 2003 Elsevier Science B.V.
Advanced Chemical Deposition Techniques—from Research to Production, Rainer Waser, Theo Schneller, Susanne Hoffmann-Eifert & Peter Ehrhart; Integrated Ferroelectrics, 2001, vol. 36, pp. 3-20.
Towards the limit of ferroelectric nanosized grains; A Roelofs, T. Schneller, K. Szot and R. Waser; 2003 Institute of Physics Publishing, Nanotechnology 14, pp. 250-253.
Nanosize ferroelectric oxides—tracking down the superparaelectric limit; A. Rudiger, T. Schneller, A. Roelofs, S. Tiedke, T. Schmitz, R. Waser; Appl. Phys. A 80, 1247-1255 (2005).
Piezoresponse force microscopy of lead titanate nanograins possibly reaching the limit of ferroelectricity; A. Roelofs, T. Schneller, K. Szot, R. Waser; Appl. Phys. Letters vol. 81, No. 27, Dec. 30, 2002.
Dielectric Properties and Strain Analysis in paraelectric $ZrTiO_4$ Thin Films Deposited by DC Magnetron Sputtering; T. Kim, J. Oh, B. Park & K.S. Hong; Jpn. J. Appl. Phys. vol. 39 (2000) pp. 4153-4157.
Sol-Gel Synthesis of CMR Manganites by Annika Pohl.
Thousandfold Change in Resistivity in Magnetoresistive La—Ca—Mn—O Films, S. Jin, T.H. Tiefel, M. McCormack, R.A. Fastnacht, R. Ramesh, L.H. Chen; Science, New Series, vol. 264, No. 5157 (Apr. 15, 1994), 413-415.
Processing magnetoresistive thin films via chemical solution deposition; A.D. Polli, F.F. Lange, M. Ahlskog, R. Menon, A.K. Cheetham; Journals of Material Research, vol. 14, No. 4, Apr. 1999.
Sol-gel epitaxial growth 1f $La_{1-x}Ca_xMnO_3$ with colossal magnetoresistance effect; Seung-Young Bae & Shan Xiang Wang; Appl. Phys. Lett 69 (1) Jul. 1, 1996.
Synthesis and characterization of novel homo- and hetero-leptic alkoxometallates of manganese (II); R.K. Dubey, A. Singh, R.C. Mehrotra; Indian Journal of Chemistry, vol. 31A, Mar. 1992, pp. 156-159.
Giant Magnetoresistance and Related Properties of Rare-Earth Manganates and Other Oxide Systems; C.N.R. Rao, A.K. Cheetham & R. Mahesh; 1996 American Chemical Society.
Sol-Gel Processing of $PbTiO_3$, $PbZrO_3$, PZT, and PLZT Thin Films; K. D. Budd, S.K, Dey and D.A. Payne; Br. Ceram. Proc. 36, 107-21 (1985).
Fabrication of Lanthanum Manganese Oxide Thin Films on Yttria-Stabilized Zirconia Substrates by a Chemically Modified Alkoxide Method; H.J. Hwang, A. Towata & M. Awano; J. Am. Ceram. Soc. 84 (10) 2323-27 (2001).
Preparation of $La_{0.75}Sr_{0.25}MnO_3$ Nano-Phase Powders and Films from Alkoxide Precursors; A. Pohl & G. Westin; Journal of Sol-Gel Science and Technology 26, 257-260, 2003.
Preparation of $La_{0.67}Ca_{0.33}MnO_3$ Nanophase Poweders; A. Pohl & G. Westin; Chem. Matter 2002, 14, 1981-1988.
Patterning of Rare-Earth Manganate Thin Layer Using Self-Assembled Organic Thin-Film Templates; Duk-Young Jung & David Payne; Korean Chem. Soc. 1999, vol. 20, No. 7.
Metal Propionate Synthesis of Magnetoresistive $La_{1-x}(Ca, Sr)_xMnO_3$ Thin Films; U. Hasenkox, C. Mitze and R. Waser; J. Am. Ceram. Soc. 80 (10) 2709-13 (1997).
The Development of Alkoxy-Based Sol-Gel Processing for Magnetoresistive Manganite Thin Films by Brent Allen Clothier.
Mediated Patterning of Sol-Gel Thin Layers: Shrinkage, De-Cohesion, and Lift-Off by Erik Arthur Mikalsen.

* cited by examiner

MANGANITE PEROVSKITE CERAMICS, THEIR PRECURSORS AND METHODS FOR FORMING

This invention was made with Government support under Contract Number DEFG02-91ER45439 awarded by The Department of Energy. The Government has certain rights in the invention.

FIELD OF INVENTION

This invention generally relates to the chemical processing of metal alkoxides to form sols; manipulation and transformation of the sols to form manganite ceramics having magnetoresistance properties; the ceramic materials, including coatings and films, resulting from the manipulation and transformation of sols; and magnetic-sensing ceramic devices which utilize the manganite ceramic's magnetoresistance properties and is the subject of a doctoral thesis of one of the inventors. The thesis is entitled, "The Development of Alkoxy-based Sol-Gel Processing for Magnetoresistive Manganite Thin Films" (2005), which, with the filing of this application, is being deposited in the library system at the University of Illinois, Champaign, Ill., the disclosure of which is herein incorporated by reference in its entirety.

BACKGROUND

More specifically this invention relates to: (a) methods for the preparation of solutions and sols derived from alkoxide precursors that are particularly reactive and useful for preparing magnetic and/or magnetoresistive ceramics; (b) the novel alkoxide-based precursors; (c) methods for converting the solutions and sols into manganite ceramics, including coatings and films, particularly thin films; (d) the novel ceramics, coatings and films derived from these precursors, (e) methods for constructing manganite ceramic materials and devices; and (f) the novel materials and devices produced by these methods. Perovskite manganite ceramic materials typically exhibit magnetoresistance properties useful for integration into hybrid microelectronics as solid-state sensors and non-volatile memory elements. Changes in electrical resistance caused by external electrical or magnetic fields or by temperature changes allow manganite ceramics, when based on the lanthanide series and doped with divalent cations, to sense magnetic fields and heat. As a result, the perovskite ceramics can enhance magnetic recording systems as well as thermal and infrared detectors.

Manganite ceramics can also be based on certain non-lanthanide elements, provided the non-lanthanide elements have a chemistry similar to the "true lanthanides," and are capable of forming +3 ion having a size similar to a "true lanthanide" +3 ion. Yttrium is one example of such a non-lanthanide element having these properties that can be used to form the novel ceramics described in more detail below. As used herein, the term Ln represents elements from the lanthanide series and other non-lanthanide elements having the features described above.

Some of the techniques used to prepare manganite ceramic devices include chemical vapor deposition and sputtering, spin-coating of chemical solutions, laser ablation, electron beam deposition and ion beam deposition. Of these methods spin coating generally requires less capital investment, is less expensive to operate and has fewer restrictions as to size and shape of the substrate coated. Industrial spin-coating methods have several requirements. A superior precursor solution system used for a spin-coating process should: (1) be derived from available starting materials, (2) not contain particulate matter, (3) have sufficient shelf life to allow for processing, (4) be capable of bonding to the substrate, (5) have the proper rheology to form a uniform coating, (6) be highly reactive during the coating process so that a gel is formed preserving the coating's uniformity, and (7) provide a gel having sufficient reactivity to provide a manganite ceramic coating of uniform thickness without breaks or defects over the coated area without requiring temperatures high enough to damage the desired substrate. Aspects of this invention, the novel precursor solutions containing sols, methods for preparing and converting the precursor solutions into perovskite ceramics address these needs.

SUMMARY

As will become apparent from the following discussion, one aspect of this invention provides for a novel method for preparing sol systems derived from alkoxide-based precursors that can be readily converted into a manganite ceramic materials or devices under generally mild conditions that do not damage the substrates. The precursor solutions containing sols are prepared by:

(a) selecting a manganese alkoxide of the formula $Mn(OR)_2$ and at least one metal alkoxide selected from the group consisting of $Ln(OR)_3$ and $M(OR)_2$, wherein
  i) Ln is La, Ce, Pr, Nd, Pm, Sm, Eu, Gd, Tb, Dy, Ho, Er, Tm, Yb, Lu, or Y;
  ii) M is Ca, Sr, Ba, Cd, or Pb, and
  (iii) R is $C_2$ to $C_6$ alkyl, $C_3$ to $C_9$ alkoxyalkyl, or $C_6$ to $C_9$ aryl;

(b) contacting or combining the alkoxides with an anhydrous deoxygenated solvent under a dry and inert atmosphere; and (c) adding sufficient deoxygenated water to partially hydrolyze the metal alkoxides to form a fluid manganite precursor containing a sol.

The metal alkoxides can be combined as solids and then dissolved or each dissolved separately to provide individual solutions and the solutions combined. The order of these steps is not important. The selected alkoxides react when combined at room temperature to provide soluble, dispersed oligomeric species in the appropriate solvent. Because the soluble, dispersed oligomeric species further reacts with the added water to give a homogeneous precursor solution containing a sol, filtration before use is not required. A sol contaminated with particulate matter can form inferior thin films and is undesirable. The preparation of a satisfactory film from such a contaminated sol generally requires removal of the particulate matter by filtration before the sol can be used in a spin-coating process. Preferred embodiments of the method described provide homogeneous sols having an appropriate shelf life when protected from oxygen and additional water, a viscosity that allows proper coating of a substrate, and sufficient reactivity to quickly form a gel. Sufficient deoxygenated water has been added when a sol having these desired properties has been formed. The preferred manganite precursors are obtained as described above when sufficient water has been added to provide a hydrolysis ratio of about 0.05 to about 1 where the hydrolysis ratio is defined as the number of moles of water added divided by the number of moles of metal alkoxides selected.

Another aspect of this invention is a method for forming a manganite ceramic coating by: (a) preparing the precursor solution containing a sol as described above;
(b) selecting a substrate;
(c) applying the precursor solution to the substrate; and (d) heating the coated substrate to form a ceramic coating. Solvent evaporation and contact with moisture in the air during the precursor's application quickly transforms the sol into a gel. Heating the gel to about 450° C. results in the removal of volatiles and the formation of an amorphous material. Upon further heating to at least about 600° C., the amorphous solid is transformed into a crystalline ceramic coating. Because of the high reactivity of the preferred metal alkoxides, generally lower temperatures are required to transform the amorphous oxide into a perovskite ceramic material. As a result a variety of common substrates can be used, including silicon-based substrates, without damage to the substrate. Suitable substrate shapes can include, but are not limited to disk shaped objects and the like.

A still further aspect of this invention involves methods for forming ceramic materials having physical forms other than films. Physical forms can include coated objects, solid ceramic objects, and the like. Some examples of coated objects include fibers, other three-dimensional articles, particles and the like. Solid objects can be prepared by forming the ceramic material in a mold or by pressing an amorphous powder or a gel into the desired form followed by additional heating to affect crystallization. Coated objects can be formed by preparing a precursor solution containing a sol as described herein; dipping; coating or otherwise contacting a substrate with the precursor solution; allowing solvent evaporation and contact with additional moisture to complete gel formation; and heating the coated object or objects in the presence of oxygen to drive off volatiles and effect crystallization forming a manganite ceramic. Regardless of the ceramic's physical form, the preferred transformations generally proceed through the formation of a precursor solution containing a sol, conversion to a gel, removal of volatiles from the gel to form an amorphous solid and finally crystallization at an elevated temperature to form a ceramic material. The reactive sols described can be transformed into ceramics at surprisingly low temperatures which are compatible with a larger number of substrates. The ceramic films and material produced by the processes described are uniform, defect free, and have superior properties. Their magnetoresistance properties make the novel perovskite films described valuable components for variety of integrated circuit devices and the like.

Preferred ceramic materials regardless of their architecture have the general formula, $Ln_{1-x}M_xMnO_3$, where $0 \leq x \leq 1$; where Ln is La, Ce, Pr, Nd, Pm, Sm, Eu, Gd, Th, Dy, Ho, Er, Tm, Yb, Lu, or Y; and M is Ca, Sr, Ba, Cd, or Pb. The more preferred ceramic materials, whether a coating or other form, have the general formula $Ln_{1-x}M_xMnO_3$ where $0.2 \leq x \leq 0.4$ where Ln is La, Pr, Nd, or Gd. Coatings based on the more preferred ceramics display a generally uniform composition over the coating's entire surface. Related objects and advantages of the present invention to those already stated above will be apparent from the following description.

DESCRIPTION

Figure 1:
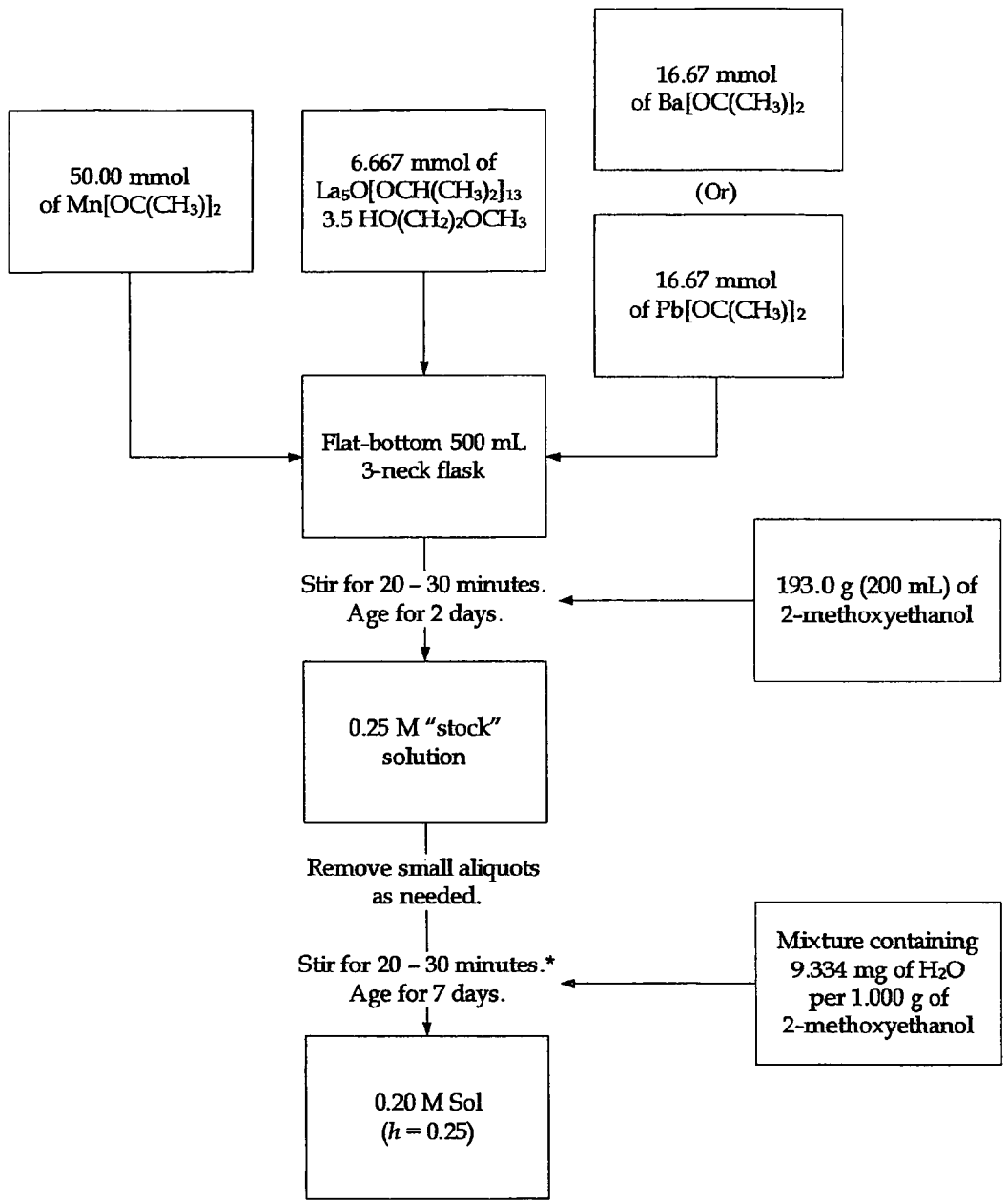
FIG. 1 is a schematic drawing illustrating, in accordance with the present invention, two embodiments of the steps for preparing a perovskite precursor solution containing a sol.

For the purposes of promoting an understanding of the principles of the invention, reference will now be made to specific embodiments and specific language will be used to describe the same. It will nevertheless be understood that no limitation of the scope of the invention is thereby intended. Any alterations and modifications in the described invention, and any further applications of the principles of the invention as illustrated therein are contemplated as would normally occur to one skilled in the art to which the invention relates.
Sol-Gel Processing:

It is one object of the present invention to provide a sol-gel process for preparing manganite ceramics that can be transformed into crystalline perovskite ceramics that are chemically homogeneous and defect free without exceeding processing temperatures in the range of about 650° C. A first step is the preparation of a precursor solution or sol having rheological and chemical properties that allow the sol to be processed into a gel having a proper form that can be further reacted at relatively low temperatures to provide a desired ceramic material. Although the following discussion primarily focuses on the formation of ceramic films, the materials disclosed and the principles described can also be applied to the formation of ceramic fibers, ceramic articles and the like.

One aspect of the preparation of a precursor solution involves selecting a manganese alkoxide of the formula $Mn(OR)_2$ and at least one metal alkoxide of the formula $Ln(OR)_3$ or $M(OR)_2$, and where:

Ln is La, Ce, Pr, Nd, Pm, Sm, Eu, Gd, Tb, Dy, Ho, Er, Tm, Yb, Lu, or Y,

M is Ca, Sr, Ba, Cd or Pb, and R is $C_2$ to $C_6$ alkyl, $C_3$ to $C_9$ alkoxyalkyl, or $C_6$ to $C_9$ aryl.

Because transition metal methoxides tend to form unreactive infinite polymers upon dissolution in a solvent, bulkier alkoxides are generally preferred. Such bulkier alkoxides typically form reactive discrete soluble metal monomers or oligomers rather than insoluble and unreactive infinite polymers. Alkoxides having about 9 or less carbons are also generally preferred. Alkoxides having more than 9 carbons generate larger amounts of $CO_2$ during the crystallization process causing increased imperfections in the resulting ceramic film.

The alkoxides can be selected and combined prior to contacting with an anhydrous deoxygenated solvent; individual alkoxide solutions can be prepared and combined; or where formed, adducts of the solvent and an alkoxide can be prepared, isolated, and then contacted with other selected alkoxides or adducts of alkoxides. Example 6 illustrates an example of adduct formation upon dissolving 2-propoxo lanthanum in the solvent, 2-methoxyethanol. Example 1 utilizes the isolated lanthanum oxoalkoxide adduct with other metal alkoxides to prepare a manganite precursor.

Other factors affecting oligomerization include solute concentration and the nature of the solvent. Unlike the unreactive polymeric methoxides, the monomeric or oligomeric metal alkoxides are highly reactive, and upon hydrolysis, readily form oxo-polymeric intermediates, sols and/or gels, which can be converted into superior ceramic materials. Suitable solvents include, but are not limited to aliphatic and aromatic hydrocarbons, alcohols, ethers, nitriles, and heterocyclics such as pyridine. The individual alkoxides may be insoluble in a solvent, provided they react when combined in the selected solvent to form soluble oxygen bridged intermediates.

To form a ceramic having of the formula, such as for example, $Ln_{0.67}M_{0.33}MnO_3$, the appropriate metal alkoxides or their solvent adducts ($Ln(OR)_3$:$M(OR)_2$:$Mn(OR)_2$ in an approximately 2:1:3 molar ratio) are contacted with an anhydrous deoxygenated solvent under a dry and inert atmosphere at ambient or elevated temperatures to form a solution. Additional deoxygenated solvent containing a predetermined amount of water is added to the solution of metal alkoxides, initiating the formation of a sol. Addition of water initiates hydrolysis and condensation reactions that cause the oligomeric alkoxide species to link through a metal-oxygen framework. Polymerization generally proceeds at a rate and to an extent that depends on solute concentrations, the nature of the solvent, the nature and bulk of the R group, and the amount of water added. Although the more reactive sites on the oligomers initially react in forming a sol, upon aging, some crosslinking and redistribution of oxygen atoms throughout the sol's initially formed network appears to occur. Precursor solutions can similarly be prepared by selecting a manganese alkoxide and either an alkoxide having the formula $Ln(OR)_3$ or an alkoxide having the formula $M(OR)_2$ or their respective solvent adducts.

The sol is diphasic having a continuous liquid phase that suspends solid matter generally described as colloidal or polymeric, depending on their size. Colloidal sols typically contain polymer particles or aggregates ranging from about 1 to about 100 nm, whereas polymeric sols typically contain small randomly branched polymeric networks of less than about 1 nm. The terms precursor solution, sol and partially hydrolyzed solution of metal alkoxides generally describe the same material and are used interchangeably herein. Although sols are diphasic and contain a solid domain, they look and behave like solutions because the solid particles are so small. As a result sols are typically clear and transparent and are frequently described as homogeneous and referred to as solutions.

In proceeding from a solution of oligomers, to a sol and to an aged sol, the material's rheology and reactivity changes. By controlling the amount of anhydrous solvent, the amount of water added and optionally aging the sol, a particularly desirable rheology, reactivity, and shelf-life can be obtained. Typically, the addition of smaller amounts of water provides sols having longer shelf lives, lower levels of polymerization, and increased reactivity, whereas the addition of larger amounts of water provides sols having reduced shelf lives, higher levels of polymerization, and decreased reactivity. Aging is believed to allow for the redistribution of oxygen atoms, creating a polymeric framework that can be more readily converted to a ceramic structure at lower temperatures.

In order to prepare a continuous thin film, the viscosity of the precursor solution is adjusted by selecting the proper amounts of the anhydrous solvent and by adjusting the level of oligomerization affected by the addition of water. For the preparation of a continuous film, the precursor solution should have a viscosity that allows complete wetting of the substrate and retention of an appropriate continuous layer of the precursor solution that upon gelation will provide a continuous film.

The use of extremely dilute precursor solutions in chemical solution depositions have recently been found to result in the formation of discontinuous films containing crystallites [See: Nanosize ferroelectric oxides—tracking down the superparaelectric limit, A. Rüidiger, T. Schneller, A. Roelofs, S. Tiedke, T. Schmitz, and R. Waser, *Appl. Phys. A* 80, 1247-1255 (2005)]. As these single grains have approached a size in the range of about 10 nm, the single grains appear to lose their ferroelectric properties and exhibit superparaelectric properties [See: Piezoresponse force microscopy of lead titanate nanograins possibly reaching the limit of ferroelectricity, A. Roelofs, T. Schneller, K. Szot, and R. Waser, Applied Physics Letters, Vol. 81, Number 27, 5231-5233 (2002)]. Embodiments of the current invention include extremely dilute precursor solutions capable of generating discontinuous films that transition from ferromagnetic, to paramagnetic and superparamagnetic phases, as the crystallite domains approach a size in the range of about 10 nm. Further embodiments of the current invention additionally include such discontinuous films prepared from extremely dilute precursor solutions wherein the discontinuous film is separated into crystallites. Additionally, still further embodiments of the current invention include the methods for forming discontinuous films utilizing the novel extremely dilute precursor solutions.

Failure to partially hydrolyze a perovskite precursor solution prior to coating a substrate can cause the solution to be particularly reactive to atmospheric moisture. This can, in turn, cause a "skin" to form and affect the solution's rheology during the coating process by reducing substrate wetting and gel adhesion thus causing compositional inhomogeneities and non-uniform film morphology. Further, films formed from unhydrolyzed alkoxide solutions and minimally hydrolyzed sols readily pick up $CO_2$ and retain high levels of hydrocarbon fragments which during later pyrolysis can generate high levels of $CO_2$ and water vapor causing disruption of a films surface. Sols having an appropriate level of polymerization generally produce gels which adsorb lower levels of $CO_2$ and have lower levels of hydrocarbon content and as a result, upon pyrolysis and sintering, provide superior ceramic materials.

Further significant growth of the polymeric network within a sol results in a sharp rise in viscosity caused by gel formation. Gel formation is promoted by further exposure to water, air and the evaporation of solvent. Because the gel's viscoelastic behavior interferes with a coating process, it is important that the coating mixture be maintained primarily as a sol until the substrate has been coated, but that gel-formation occurs shortly after substrate coating to maintain the coating's uniformity. Gel formation can be induced either by continued slow spinning in a humidified atmosphere or by subjecting the sol-coated substrate to a humidified inert atmosphere at an elevated temperature. Sols that are sufficiently polymerized to allow gel-formation to result primarily from solvent evaporation very soon after the substrate has been coated are particularly desired. Similarly, sols that are sufficiently polymerized to form gels upon heating to temperatures in the order of 100° C. or more in a humidified atmosphere are similarly desired. Ceramics other than films similarly benefit from the simple transition from sol to gel upon solvent evaporation or heating in a humidified atmosphere, prior to pyrolysis and sintering.

Sol Preparation:

All solvents and reagents except water were scrupulously dried and all solvents and reagents degassed with dry argon before use. Under a dry oxygen-free argon atmosphere the metal alkoxides were weighed into a dry glass flask in the appropriate ratios and dissolved in 2-methoxyethanol with stirring to create an unhydrolyzed stock solution. After about 15 minutes, translucent pink to orange solutions resulted. The solutions were protected from oxygen to avoid the precipitation of a brown oxide that alter the ceramic's stoichiometry and would have to be removed by filtration. A solution of water in 2-methoxyethanol was prepared and measured portions of this aqueous solution added to portions of a stock solution according to the level of partial hydrolysis desired. Upon adding the appropriate amount of hydrolysis solution, the mixture was sealed and stirred for about 30 minutes. Improved coatings were obtained when the partially hydrolyzed solutions were allowed to stand protected from additional moisture and oxygen for up to about 3 days or longer. The aging process is believed to allow hydrolysis to proceed smoothly to the desired level and produce the proper level of cross-linking. Depending on the level of hydrolysis, the partially hydrolyzed solutions are able to maintain their stability and a nearly constant viscosity for up to about 5 months under anhydrous anaerobic conditions. Partially hydrolyzed solutions containing the following stoichiometry were prepared as described above: $La_{2/3}Ba_{1/3}MnO_3$ and $La_{2/3}Pb_{1/3}MnO_3$.

TABLE I $La_{2/3}Ba_{1/3}MnO_3$

| Sol # | H (hydrolysis ratio) | Appearance | Stability |
|---|---|---|---|
| 1 | 0.25 | transparent orange | viscosity suitable for spinning for 4-5 months |
| 2 | 0.75 | transparent orange | viscosity suitable for spinning for 1-2 months |
| 3 | 1.25 | orange, becoming turbid within 2 weeks | unsuitable for spinning |

TABLE-US-00002 TABLE II La.sub.2/3Pb.sub.1/3MnO.sub.3 H (hydrolysis Sol # ratio) Appearance Stability 4 0.25 transparent viscosity suitable pink/orange for spinning for 4-5 months 5 0.75 transparent viscosity suitable pink/orange for spinning for 1-2 months 6 1.25 pink/orange, unsuitable for becoming spinning, gelled viscous within 1 month within 2 weeks The methods described above can similarly be used to prepare perovskite precursors or sols having the formula Ln.sub.1−xM.sub.xMn, where Ln is La, Ce, Pr, Nd, Pm, Sm, Eu, Gd, Tb, Dy, Ho, Er, Tm, Yb, Lu, or Y; M is Ca, Sr, Ba, Cd or Pb; and 0.ltoreq.x.ltoreq.1. Film Formation:

Film Formation:

Suitable substrates, such as Si(100) or platinized-Si(100) 1 cm×1 cm squares or full 3 inch wafers, were cleaned and mounted onto a standard spin-coater in an open room. In an argon glove box, a perovskite precursor was drawn from a vial using a dried syringe having an air-tight sheath. The filled syringe was inserted into the sheath and removed from the glove box. After a few drops of the precursor were ejected to the side and additional precursor was ejected directly onto the substrate, the syringe was returned to its air-tight sheath and the coated substrate was subjected to a rapid spin-up to about 3000 rpm. After about 30 seconds at about 3000 rpm, the coated substrate was allowed to spin at about 100-200 rpm in a humidified stream of air for about 10 minutes to complete hydrolysis and gel formation. Gel formation, in an early phase of heating, can also be accomplished by preparing the coating as described above and after the high speed spinning, removing the coated substrate, subjecting it to an elevated temperature in a humidified inert atmosphere. Rapid gelation has been observed at temperatures in the range of 100° C. under a humidified inert atmosphere. Slow-speed spinning can also be carried out with passage of a heated humidified stream of air or inert gas to provide superior gel coatings. A preferred inert atmosphere and a preferred inert gas are substantially free of carbon dioxide preventing the incorporation of carbonates into the sol and/or gel.

Figure 3:
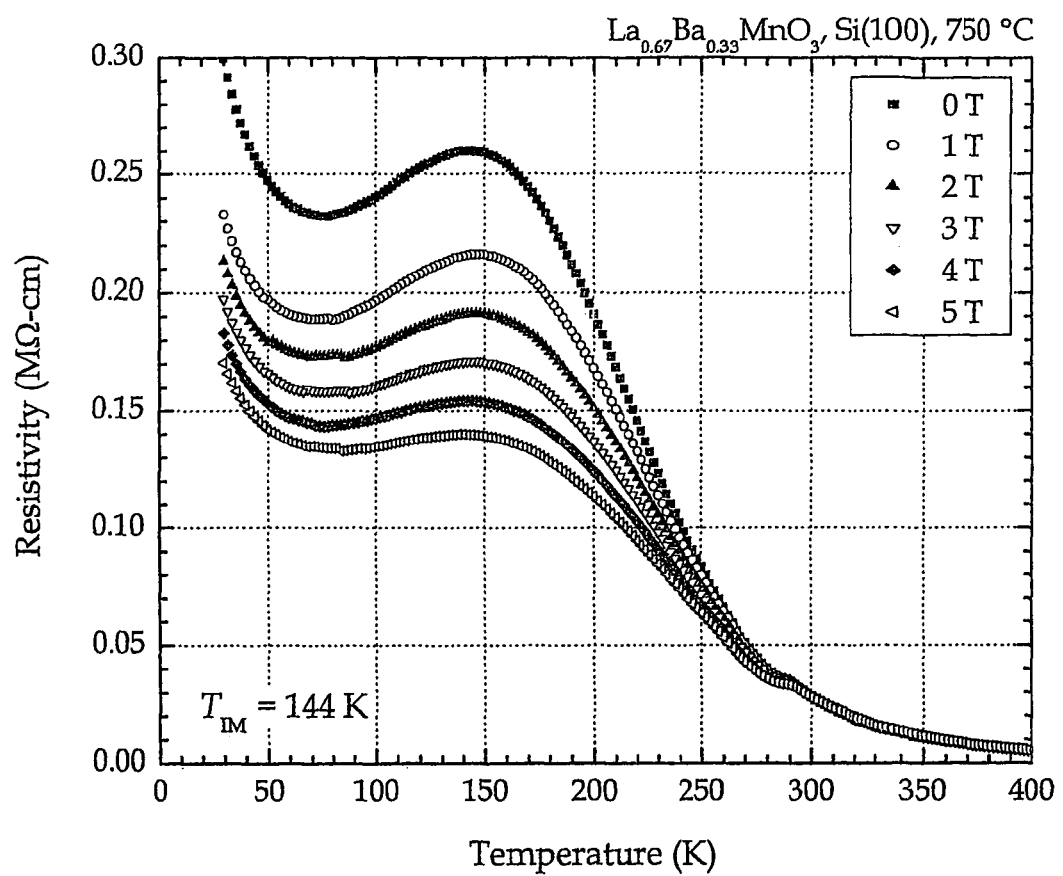
FIG. 3 is a graphical representation illustrating the magnetoresistance properties of the ceramic, $La_{2/3}Ba_{1/3}MnO_3$ deposited on Si(100).
Figure 4:
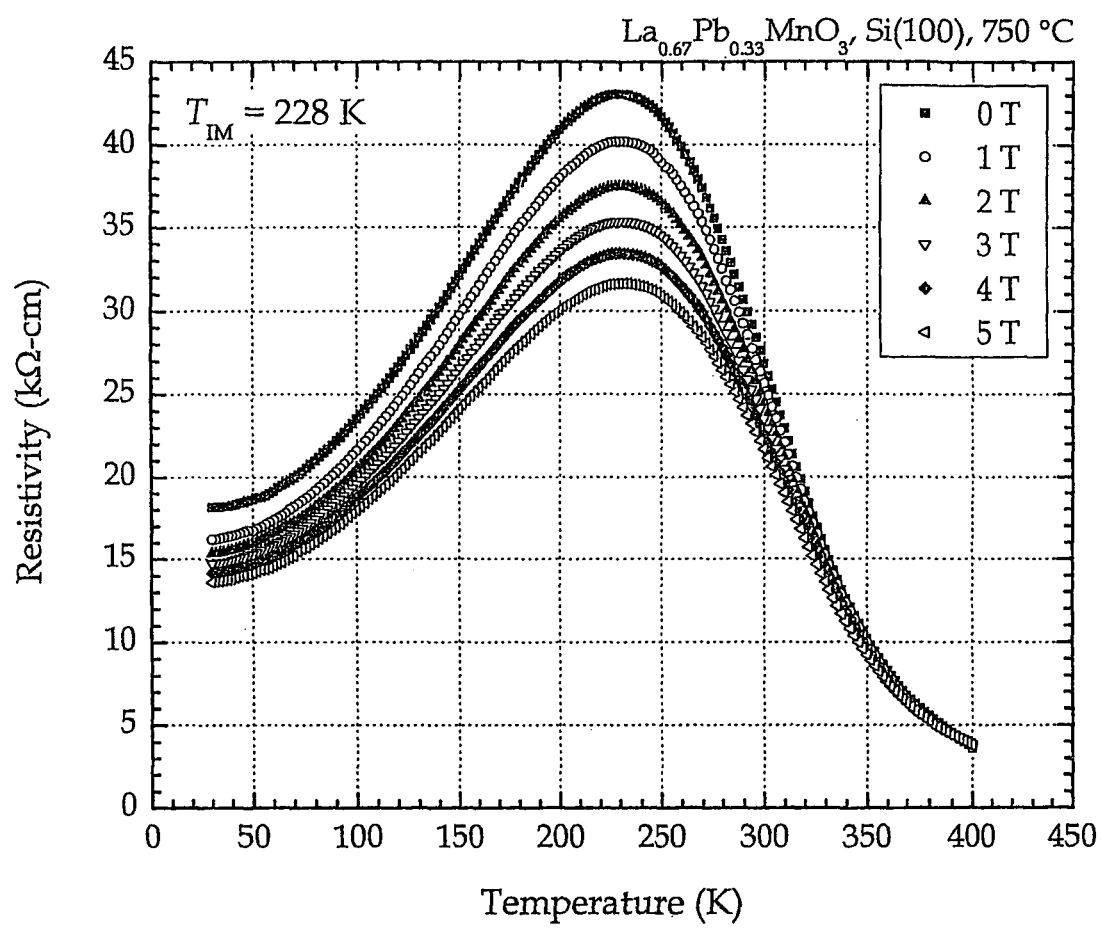
FIG. 4 is a graphical representation illustrating the magnetoresistance properties of the ceramic, $La_{2/3}Pb_{1/3}MnO_3$ deposited on Si(100).

The gel coated substrate was placed (a) onto a surface held at 100° C. for one minute; (b) onto a surface held at 300° C. and (c) onto a surface held at 450° C. to ensure the formation of a translucent, dense, crack-free amorphous oxide film. To form films having a greater thickness, the spin-coating procedure and heat treatment cycle were repeated and/or more viscous precursor solutions were employed to provide the additional necessary thickness. The viscosity of the precursor solutions can be increased by increasing the concentration of the sol and/or increasing the level of oligomerization, provided the increased oligomerization does not cause premature gelation The amorphous films prepared in this manner were crystallized by heating the coated substrates from ambient temperatures to about 650 to about 750° C., increasing the temperature at a rate of about 10° C./minute, holding the final temperature for about 30 to about 60 minutes and then cooling the coated substrate to ambient temperature at a rate of about 10° C./minute. All or a portion of the crystallization can be carried out in the presence of air, under a flow of air enriched with oxygen, under pure oxygen or a combination thereof. Improved ceramics are obtained upon heating the amorphous films in a carbon dioxide free atmosphere. Preheating the gas stream to approximate the heating cycle of the coated substrate is similarly advantageous. Electron photomicrographs of the ceramic films showed the formation Of uniform and dense structure, free of defects. Property determination of the films showed the presence of magnetoresistive behavior as illustrated in FIGS. 3 and 4.

Discontinuous films containing isolated grains or single crystal islands can be prepared from the precursor solutions following further significant dilution and/or with lower levels of oligomerization. A discontinuous film can be prepared by spin-coating a substrate with the highly diluted precursor solution, heating the coated substrate on a hotplate, for example at a temperature of about 350° C. for about 2 minutes, and rapidly annealing the substrate, for example at about 700° C. for about 10 minutes. Such discontinuous films will typically contain crystallites ranging from about 10 nm to about 200 nm in size. The conditions provided above are intended to illustrate embodiments of the current invention wherein discontinuous films can be formed and are not intended to be limiting in any manner. Such alteration of these conditions to vary the size and distribution of individual crystal domains is well within the skill of a person of ordinary skill in the art.

Preparation of Precursors:

Because of the sensitivity of the metal alkoxides to molecular oxygen and water, their preparations should be carried out under conditions that exclude water and molecular oxygen. Depending on the level of sensitivity, reactions were either carried out in glassware under an argon atmosphere or in an argon glove box. With the exception of water, all solvents utilized were purchased in anhydrous form and packed under nitrogen or argon. Prior to their use all liquids utilized, including water, were refluxed in argon and all solvents were additionally purged of residual oxygen by bubbling argon through the liquid via a gas-dispersion tube for about 12 hours. Similarly, all equipment that would contact any reactant was scrupulously cleaned and dried prior to its use.

The alkali metal earths including barium can be easily prepared by reacting the purified raw metal with excess alcohol in an inert solvent such as toluene under argon.

where Z=Ca, Sr, Ba

The remaining alkoxides (Z=La, Pr, Nd, Gd, Mn, Cd and Pb) can be prepared by a silylamide route involving two steps from lithium silylamide. Similarly, the alkoxides where Z=Ce, Pr, Pm, Sm, Eu, Tb, Dy, Ho, Er, Tm, Yb, Lu or Y can be prepared through the silylamides route. First Li{N[Si(CH$_3$)$_3$]$_2$} is reacted with a metal halide to form an intermediate metal silylamide that is then reacted with an alcohol to form the metal alkoxide and HN{Si(CH$_3$)$_3$}$_2$.

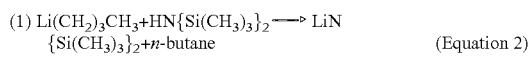 (Equation 2)

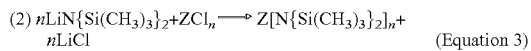 (Equation 3)

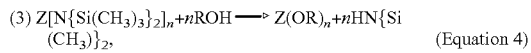 (Equation 4)

where R is C$_2$ to C$_6$ alkyl, C$_3$ to C$_9$ alkoxyalkyl, or C$_6$ to C$_9$ aryl.

The metal alkoxides prepared were analyzed by standard methods and the results summarized in Table III, below.

A modified silylamide method utilizing tin(II) silylamide can also be used to prepare the alkali metal alkoxides. The first step involves the reaction of tin(II) silylamide with the alkali metal to give an alkali metal silylamide and tin metal. The second step involves the reaction of the alkali metal silylamide with an alcohol to give the alkali metal alkoxide and HN{Si(CH$_3$)$_3$}$_2$.

To prepare alkoxides suitable for use in forming preferred sol's, the choice of alcohol is important. For example, the methoxides of the alkali metals tend to form insoluble polymeric species that cannot be readily processed to form a sol. Alcohols having maximum branching with a minimum number of carbon atoms are generally preferred. The preparation of all alkoxides were conducted under argon, either in a glove box (i.e., weighing, grinding, etc.) or within Schlenkware (i.e., reflux, filtration, etc.).

Sols derived from Mn(OR)$_2$ and either Ln(OR)$_3$ or M(OR)$_2$ can be similarly prepared by selecting the appropriate alkoxides and partially hydrolyzing a solution of the alkoxides as described above. The amount of water utilized can be reduced to maintain a similar hydrolysis ratio.

Example 1

Preparation of Sols

All reactants and solvents including water were degassed with argon and all reactants and solvents except for water were scrupulously dried before use. All of the manipulations described below were carried out in an argon glove box. For the purpose of sol formation, the alkoxides can be used directly or, depending on the solvent chosen, reacted with solvent to form a solvent adduct that can be used directly or first isolated as a solid. In the example below, 2-propoxo lanthanum was converted to its oxoalkoxide La$_5$O[OCH(CH$_3$)$_2$]$_{13}$ by dissolution of 2-propoxo lanthanum in 2-methoxyethanol (see Example 6), the resulting oxoalkoxide adduct isolated as a solid and used as a substitute for 2-propoxo lanthanum.

A 0.25 M La-Ba-Mn stock standard solution was prepared by combining 6.667 mmol of La.O [OCH(CH3)2]13' 16.67 mmol of Ba[OC(CH3)3]2' and 50.00 mmol of Mn[OC(CH3)3]2 with 193.0 g (200 mL) of 2-methoxyethanol, stirring the mixture for about 20 to about 30 minutes and aging the mixture for about 2 to about 3 days. A 0.25 M La—Pb—Mn standard solution was similarly prepared by combining 6.667 mmol of LasO[OCH(CH3)2]13' 16.67 mmol of Pb[OC(CH3)3]2, and 50.00 mmol of Mn[OC(CH3)3]2 with 193.0 g (200 mL) of 2-methoxyethanol, stirring the mixture for about 20 to about 30 minutes and aging the mixture for about 2 to about 3 days.

A first 0.20 M Sol was prepared by adding 0.2223 g of the hydrolysis mixture (9.334 mg of water per 1.000 g of 2-methoxyethanol) for each 1.000 g of the 0.25 M La—Ba—Mn (2:1:3) stock solution. A second 0.20 M Sol was prepared by adding 0.2211 g of the hydrolysis mixture for each 1.000 g of the 0.25 M La—Pb—Mn (2:1:3) stock solution. Each of the sols formed were stirred for about 20 to about 30 minutes and aged for up to about 7 days. The hydrolysis ratio for each sol was 0.25. FIG. 1 illustrates two embodiments of the steps for preparing a perovskite precursor solution containing a sol. This procedure was repeated with hydrolysis mixtures containing greater amounts of water to form sols having hydrolysis ratios of 0.75 and 1.25.

The La—Ba—Mn (2:1:3) sol having a hydrolysis ratio of 1.25 became turbid within about 2 weeks, became viscous within about one month and gelled within about 1 year. In contrast, the La—Pb—Mn (2:1:3) sol having a hydrolysis ratio of 1.25 became viscous within about 2 weeks and gelled within about 1 month. Both sols having a hydrolysis ratio of 0.75 maintained a viscosity suitable for spin-coating for about 1 to about 2 months whereas the sols having a hydrolysis ratio of 0.25 maintained a viscosity suitable for spin-coating for more than about 4 to about 5 months.

Example 2

Gelation of Precursor Solutions and Sols

The effects of air, moisture, and solvent evaporation on gelation were studied demonstrating the importance of evaporation in forming a suitable gel. First, aliquots of unhydrolyzed (h=0) precursor solutions described above (Example 1) based on La—Ba—Mn (2:1:3) and La—Pb—Mn (2:1:3) were placed in shallow dishes in an argon glove box. The samples were removed and exposed to a normal atmosphere and observations recorded. A brown precipitate immediately formed, grew, and sank to the bottom of the liquid. Within about 2-3 minutes a translucent orange or pink/orange colored mixture resulted with a brown to black solid suspension becoming more predominant with time. Within about 10-15 minutes the mixture became gel-like and within about 1 hour the dark gel that formed had significantly shrunk forming large cracks.

Second, aliquots of a sol (h=0.25) described above (Example 1) were placed in shallow dishes in an argon glove box and then placed on a raised platform within a sealed gelation chamber. A pool of deionized water was added to the chamber beneath the sol and the chamber sealed. After about 12 hours, a clear, orange, translucent disc formed as a result of gelation. The gel formed from the La—Ba—Mn (2:1:3) sol underwent shrinkage as the result of syneresis.

Finally, aliquots of a sol (h=0.25) described above (Example 1) were placed in shallow dishes in an argon glove box and then placed on a raised platform within a sealed gelation chamber. The chamber was then connected to an inert-gas manifold and a strong flow of ultra-high purity argon was passed overhead to affect evaporation of the solvent. Over about 2 days the sols congealed to form semi-transparent orange-brown (La—Ba—Mn) and lavender (La—Pb—Mn) gels.

Example 3

Formation of Ceramics by Spin Coating Sols (a) Substrates—Two silicon substrates were coated: (1) p-type, boron-doped Si(100) from Komatsu Electronics, Ltd., and (2) thermally-oxidized (i.e., 5000 Å), p-type, boron-doped Si(100) from Silicon Quest, Intl. The surface of the latter was sputtered with a 300 Å titanium buffer layer followed immediately by a 1700 Å platinum layer. Spin-coating was carried out on either circular wafers having a diameter of 3 inches or less or 1 cm×1 cm squares. Square substrates were prepared by scoring centimeter-spaced, orthogonal lines onto the backside of a circular wafer with a diamond scribe. The wafers were fractured, individual pieces cleaned, and the polished side inspected for defects.

(b) Substrate Preparation—Before spin-coating, substrates were subjected to the following cleaning process: (I) ultrasonication in methanol for about 10 minutes, (2) ultrasonication in acetone for about 10 minutes, and (3) ultrasonication in water for about 10 minutes. Between each treatment, substrates were blown dry with filtered, compressed air. The substrates were next placed and maintained on a 300° C. hot plate for about 5 minutes to volatilize any residual organics. When initially mounted into a standard spin-coater in an open room, the substrate was covered by the host solvent, 2-methoxyethanol, and spun at about 3000 rpm for about 30 seconds. After repeating this solvent treatment and spinning two more times, the substrate was ready for coating.

(c) Spin-Coating—In an argon glove box, a perovskite precursor was drawn from vials using dried syringes having an air-tight sheath. The filled syringes were inserted into the sheath and removed from the glove box. After a few drops of the precursor were ejected to the side, additional precursor was ejected directly onto the substrate, the syringe was returned to its air-tight sheath, and the coated substrate was subjected to a rapid spin-up to about 3000 rpm. Within 2-3 seconds of the sol's application to the substrate, fine brown particles began to form. However, angular acceleration induced by immediate spinning swept the surface layer off the substrate leaving a gel coating free of particulate material. After about 30 seconds at about 3000 rpm, the coated substrate was allowed to spin at about 50 to about 200 rpm in a humidified stream of air (75% humidity) for about 5 to about 10 minutes to complete hydrolysis and gel formation.

The coated substrate was removed from the spincoater and placed (a) onto a hot surface held at about 100° C. for about one minute; (b) onto a hot surface held at about 300° C. for about one minute and (c) onto a hot surface held at about 450° C. for about three minutes to ensure the formation of a translucent, dense, crack-free amorphous oxide film. To form films having a greater thickness, the spin-coating procedure and heat treatment cycle were repeated (typically two more times) to provide the additional necessary thickness.

Figure 2:
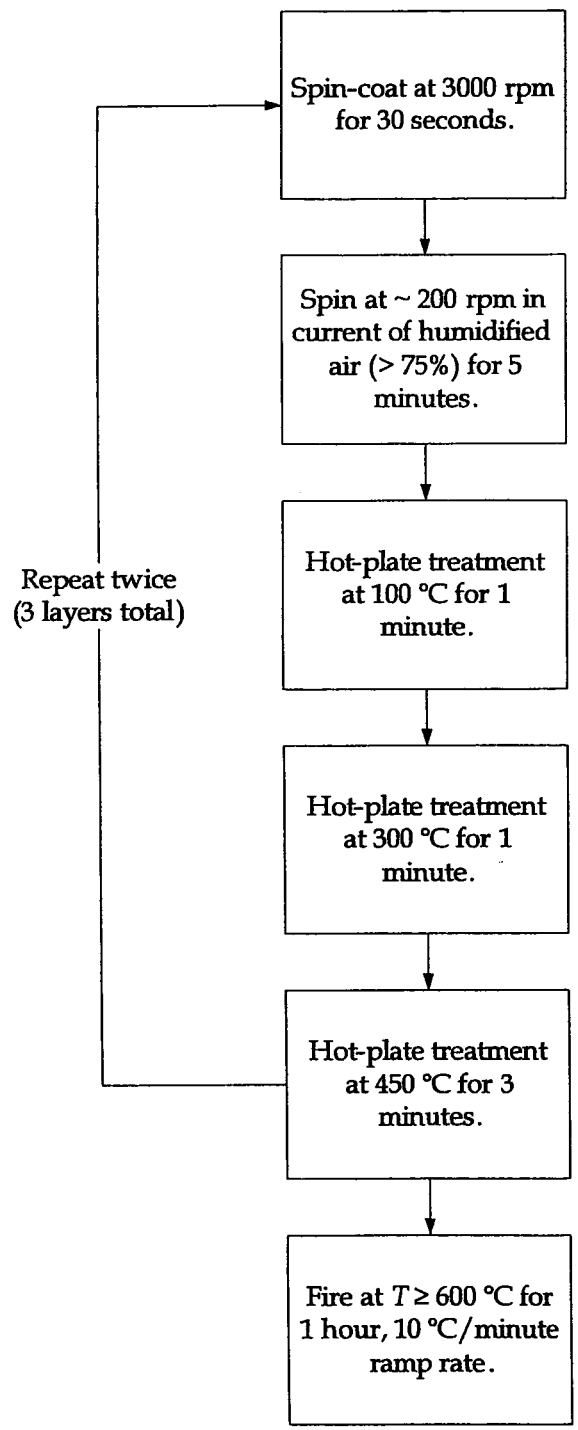
FIG. 2 is a schematic drawing illustrating, in accordance with the present invention, one embodiment of the steps for forming a thin film in a spin-coating process and transforming the film through a sequential heating process into amorphous oxide film and finally into a crystalline ceramic material.

The amorphous films were crystallized by heating the coated substrates from ambient temperatures to at least about 600° C., typically in the range of about 650° C. to about 750° C., increasing the temperature at a rate of about 10° C./minute, holding the final temperature for about 30 to about 60 minutes and then cooling the coated substrate to ambient temperature at a rate of about 10° C./minute. Electron photomicrographs of the ceramic films showed the formation of uniform and dense structure free of defects. FIG. 2 illustrates one embodiment of the steps for forming a thin film in a spin coating process and its transformation into a ceramic film. Property determination of the ceramic films showed the presence of magnetoresistive behavior as illustrated in FIGS. 3 and 4.

The methods described above can similarly be utilized to prepare discontinuous films, provided prior to the spin-coating step, the viscosity of the precursor solution is reduced by dilution (in the order of a 30-70 fold dilution) with additional anhydrous solvent and/or a reduced level of oligomerization. Preferred reduced viscosity precursor solutions, typically less than about 0.01 M in sol and more preferred precursor solutions, from about 0.003 M to about 0.007 M in sol, can be used to prepare discontinuous films that are suitable for magnetic storage and sensing. Precursor solutions having low levels of oligomerization generally require less dilution to obtain a discontinuous film.

Example 4

Formation of an Integrated Circuit Device

An integrated circuit work piece is provided with a ceramic film as follows: An integrated circuit work piece is cleaned by standard procedures and placed on a standard spin coater in an open room. The coating of a precursor solution having the metal composition of $La_{2/3}Ba_{1/3}Mn$ is applied, processed and converted to a ceramic film as described in Example 3. The film's thickness can be increased as desired by repeating the coating and heating steps to build up a thicker amorphous film before crystallization at elevated temperatures.

Additional integrated circuit devices having a ceramic film free of defects and having the formula, $Ln_{1-x}M_xMnO_3$, where Ln is La, Ce, Pr, Nd, Pm, Sm, Eu, Gd, Tb, Dy, Ho, Er, Tm, Yb, Lu or Y; M is Ca, Sr, Ba, Cd or Pb; and $0.1 \textit{toreq.} x .\textit{Itoreq.} 1$ can be prepared according to this example. Such integrated circuit devices are useful components for magnetic, thermal, or infrared detectors.

Example 5

2-Methyl-2-Propoxo Manganese (II)

Lithium silylamide, 43.613 g (0.2606 mole) and 179.45 g (202 mL) of THF were added to a flat-bottom 500 ml., 3-neck flask to give a golden yellow solution. Separately, 16.414 g (0.11304 mole) of ultra dry, 99.99% (metals basis) Manganese(II) chloride obtained from Alfa Aesar and 186.27 g (210 mL) of THF were combined in a glass reflux assembly and refluxed for about 3 hours at about 70° c., causing the solution's viscosity to increase and causing the initially formed powder to take on a faint pink hue. At ambient temperature, the lithium silylamide solution was added to the slurry causing dissolution of the fine particles and giving a transparent orange solution. THF was removed at reduced pressure causing the precipitation of lithium chloride. When the THF had been substantially removed 125.13 g (200 mL) of pentane was added and the mixture warmed with vigorous stirring to affect dissolution. Upon cooling, a two-phase reddish-orange mixture resulted that was made homogeneous with gentle warming. The warm mixture was filtered through a 4-8 urn porosity frit and pentane removed from the filtrate at reduced pressure through a heated column. Prior to the distillation a glass wool plug was inserted into the stem of the exit valve to protect the vacuum manifold from silylamide vapors while the pentane was being removed. The distillation was carried out by first placing the system under vacuum and then slowly heating the mixture to about 110° C. Solvent removal was facilitated by maintaining the distilling column's surface temperature at about 100° C. during the distillation. As the distillation proceeded, solvent removal was completed; the vacuum stabilized at about 2×IO-2 torr and silylamide condensate began to move up the distilling column. Upon seeing silylamide condensate in the column, a fresh receiving flask was submersed in liquid nitrogen and the distillation continued until only a 3-5 mL pool of rose-colored liquid remained in the distilling flask.

The distillate was next heated with vigorous stirring to about 125° C. under an argon atmosphere to remove the last traces of volatiles. After cooling and solidification, the solid was dissolved in 68.44 g (109 mL) of pentane, the solution transferred to a cylindrical flask and the pentane removed at reduced pressure with gentle heating (i.e., to about 40° C.). The flask and resulting solid were transferred to a glove box, the solid removed, ground in a motor and pestle and stored in a leak-proof container.

To prepare 2-methyl-2-propoxide manganese(II), 63.871 g (0.1700 mile) of manganese(II) silylamide was weighed into a reaction vessel equipped with a magnetic stirring bar and 177.80 g (284 mL) of pentane was added to give a flesh-colored, transparent solution. 2-Methyl-2-propanol, 26.45 g (0.3568 mile) was added to the stirred solution immediately producing lavender-white "streamers" which upon further agitation broke up to give a heavy pink slurry. The solvent with any remaining volatiles were removed at reduced pressure with vigorous stirring. In order to maintain the slurry at an even reflux, the vacuum was introduced gently and gradually. Once a majority of the liquid had been removed, the remaining mixture was heated to about 60° C. and maintained at about that temperature until the vacuum readings stabilized. The distillation vessel was then quickly back-filled with argon gas and transferred to a glove box where the pink solid was ground in a mortar and pestle and stored in a leak-proof container.

Example 6

2-Propoxo Lanthanum

Lanthanum(III) isopropoxide (#14616) was obtained from Alfa Aesar. The commercial material contained unacceptable levels of lanthanum chloride that could be removed by dissolution in 2-methoxyethanol, filtration to remove the solid chloride, and removal of solvent. This procedure provided an oxoalkoxide adduct having the formula $La_5O[OCH(CH_3)_2]_{13}·3.5\ HOCH_2CH_2OCH_3$, suitable for use to prepare perovskite precursors. Although the solution of the oxoalkoxide adduct could have been used directly, it was isolated as a solid to simplify its use.

Example 7

2-Methyl-2-Propoxo Lead(II)

Lithium silylamide, 31.690 g (0.1894 mile) and 137.13 g (154 mL) of THF were added to a round-bottom 500 ml., 3-neck flask to give a golden yellow solution. Separately, 26.343 g (0.09472 mile) of ultra dry, anhydrous 99.999% (metals basis) Lead(II) chloride (#42841) obtained from Alfa Caesar and about 135.24 g (152 mL) of THF were combined. At ambient temperature, the lithium silylamide solution was cannulated into the chloride causing an immediate reaction resulting in the reaction mixture transitioning through colors ranging from bright yellow to brownish yellow. The reaction mixture was stirred for about 4 hours at room temperature to give a homogeneous solution. Because of the increased volatility of lead(II) silylamide, additional precautions were taken to avoid its loss during solvent removal. The distillation apparatus used included a Vigreux column in addition to a stainless-steel, gas-flow metering valve. THF was removed at reduced pressure without heating followed by a pentane wash, added by cannulation into the top of the Vigreux column and along the interior sides of the distillation flask. The flask was removed from the distillation apparatus and the resulting mixture filtered through a 4-8 urn porosity frit to give a transparent orange solution that deposited an extremely faint grey film on the flask's interior surface suggesting some slight level of decomposition to form metallic lead had occurred at room temperature in combination with a weak argon over-pressure. The pentane was next removed at reduced pressure leaving a dark orange residue. Prior to the distillation a glass wool plug was inserted into the stem of the exit valve to protect the vacuum manifold from silylamide vapors while the pentane was being removed. The distillation of the lead(II) silylamide was carried out in a manner similar to the distillation of manganese(II) silylamide, except that the receiving flask was submerged in liquid nitrogen immediately after the initial pressure spike caused by escaping organic volatiles, the pressure was maintained below about 30 torr, and the main flask and column side-walls were held at about 90° C. throughout the distillation. Distillation continued until only a 3-5 mL pool of orange-colored liquid remained in the distilling flask. The flask and resulting solid were transferred to a glove box, the solid removed, ground in a motor and pestle and stored in a leak-proof container.

To prepare 2-methyl-2-propoxide lead(II), 13.202 g (0.02501 mole) of lead(II) silylamide was weighed into a reaction vessel and dissolved in 116.71 g (186 mL) of pentane was added to give a transparent solution. 2-Methyl-2-propanol, 26.45 g (0.3568 mole) was cannulated into the reaction vessel immediately causing the solution's color to transition through a tangerine-orange color to a faint-yellow color within about 3 minutes. The reaction mixture was stirred at room temperature for about 1 hour. The solvent, including any un-reacted alcohol, was removed at reduced pressure with vigorous stirring. In order to maintain the solution at an even reflux, the vacuum was introduced gently and gradually and maintained until the vacuum readings stabilized. The distillation vessel was then quickly back-filled with argon gas and transferred to a glove box where the solid was ground in a mortar and pestle and stored in a leak-proof container.

Example 8

2-Methyl-2-Propoxo Barium

Into a reaction vessel equipped for reflux and stirring were added 11.55 g (0.08411 mole) of Aldrich (#44, 188-0) barium, distilled, dendritic pieces, 99.9% and 96.55 g (112 mL) of toluene. With stirring, 50.09 g (0.6758 mole) of methyl-2-propanol was added causing the evolution of hydrogen and the formation of a hazy white precipitate around the granules of barium as they dissolved. With continued stirring the mixture was heated to about 50 to about 60° C. for about 3 hours causing consumption of all of the barium and giving a transparent yellow solution. Toluene was stripped from the solution to give an off-white solid that was maintained at reduced pressure at room temperature to give 2-methyl-2-propoxo barium in good purity. Table III, below provides elemental analysis data for the precursors prepared above obtained by standard methods.

TABLE III

| PRECURSOR | METAL, Z[a] (%) | N[a,b] (%) | Si[a] (%) | C[a] (%) | H[a] (%) | Purity[c,d] (%) | Yield (%) |
|---|---|---|---|---|---|---|---|
| (Z=Li) LiN[Si(CH$_3$)$_3$]$_2$ | 4.14(4.15) | 7.54(8.37) | [e](33.57) | 41.50(43.07) | 11.08(10.84) | 99+ | 99..2 |
| (Z=Mn) Mn{N[Si(CH$_3$)$_3$]$_2$}$_2$ | 14.54(14.62) | 6.40(7.46) | [e](29.90) | 38.21(38.36) | 9.41(9.66) | 99+ | 98.2 |
| Mn[OC(CH$_3$)$_3$]$_2$ | 27.29(27.31) | — | — | 48.19(47.77) | 9.03(9.02) | 99+ | 99+ |
| (Z=Pb) Pb{N[Si(CH$_3$)$_3$]$_2$}$_2$ | 39.21(39.24) | 5.29(5.31) | [e](21.28) | 26.90(27.30) | 7.24(6.87) | 99+ | 86.7 |
| Pb[OC(CH$_3$)$_3$]$_2$ | 57.94(58.62) | — | — | 26.78(27.19) | 4.96(5.13) | 99+ | 99+ |
| Z=Ba Ba[OC(CH$_3$)$_3$]$_2$ | 48.00(48.43) | — | — | 31.32(33.89) | 6.4(6.29) | 99+ | 99+ |

[a]Left value is the observed weight percent, right value (parentheses) is the theoretical weight percent.
[b]Slightly low nitrogen values are often reported in the literature for silylamides. One explanation stems from possible metal nitride formation during combustion analysis.
[c]Calculated using the metal, Z as the reference basis.
[d]All silylamides were subsequently tested to confirm the absence of chlorine. In addition, the manganese and lead moieties were checked to verify the absence of lithium contamination.
[e]The acidic dissolution required for metals analysis yields fugitive silicon-based species. The process of elimination by using other determined elements, however, indicates that actual silicon values are at (or near) theoretical expectations.

While applicant's invention has been described in detail above with reference to specific embodiments, it will be understood that modifications and alterations in the embodiments disclosed may be made by those practiced in the art without departing from the spirit and scope of the invention. All such modifications and alterations are intended to be covered. In addition, all publications cited herein are indicative of the level of skill in the art and are hereby incorporated by reference in their entirety as if each had been individually incorporated by reference and fully set forth.

What is claimed is:

1. A method for preparing a manganite precursor comprising:
   (a) selecting a manganese alkoxide of the formula Mn(OR).sub.2 and at least one metal alkoxide selected from the group consisting of Ln(OR).sub.3 and M(OR).sub.2, wherein
      (i) Ln is La, Ce, Pr, Nd, Pm, Sm, Eu, Gd, Tb, Dy, Ho, Er, Tm, Yb, Lu or Y,
      (ii) M is Ca, Sr, Ba, Cd, or Pb, and
      (iii) R is C.sub.2 to C.sub.6 alkyl, C.sub.3 to C.sub.9 alkoxyalkyl, or C.sub.6 to C.sub.9 aryl;
   (b) contacting the selected alkoxides with an anhydrous deoxygenated solvent under a dry and inert atmosphere to form a solution; and
   (c) adding sufficient deoxygenated water to the solution to partially hydrolyze the alkoxides to form a fluid homogeneous manganite precursor containing a partially hydrolyzed sol.

2. The method of claim 1, wherein Ln is La, Pr, Nd, or Gd.

3. The method of claim 2, wherein the anhydrous deoxygenated solvent is selected from the group consisting of an aliphatic hydrocarbon, an aromatic hydrocarbon, an alcohol, an ether, a nitrile, and an aromatic heterocycle.

4. The method of claim 3, wherein at least one selected alkoxide is contacted with the solvent and transformed into a solvent coordinated adduct.

5. The method of claim 4, wherein the adduct is an oxoalkoxide.

6. The method of claim 3, wherein the anhydrous deoxygenated solvent is an alcohol that was deoxygenated by refluxing under argon.

7. The method of claim 6, wherein the alcohol is an alkoxy substituted alcohol.

8. The method of claim 7, wherein the alkoxy substituted alcohol is methoxyethanol.

9. The method of claim 3, wherein sufficient water is added, in relation to the alkoxides selected, to provide a hydrolysis ratio of from about 0.05 to about 1, the hydrolysis ratio being defined as the moles of water added divided by the moles of alkoxides selected.

10. The method of claim 9, wherein the water was deoxygenated by refluxing under argon and the inert atmosphere comprises argon.

11. The method of claim 10, wherein the manganite precursor is aged for at least about 3 days under a dry and inert atmosphere.

12. The method of claim 3, wherein a first metal alkoxide is selected having the formula Ln(OR).sub.3, and a second metal alkoxide is selected having the formula M(OR).sub.2.

13. The method of claim 12, wherein the alkoxides are selected to provide a molar ratio of Ln(OR).sub.3:M(OR).sub.2:Mn(OR).sub.2 of about 2:1:3.

14. The method of claim 13, wherein R is isopropyl, tertiary butyl, or 2-methoxyethyl.

15. The method of claim 14, wherein Ln is La, M(OR).sub.2 is Pb[(OC(CH.sub.3).sub.3].sub.2, and Mn(OR).sub.2 is Mn[(OC(CH.sub.3).sub. 3].sub.2.

16. The method of claim 14, wherein Ln is La, M(OR.sub.2 is Ba[(OC(CH.sub.3).sub.3].sub.2, and Mn(OR).sub.2 is Mn[(OC(CH.sub.3).sub.3].sub.2.

17. A method for making an integrated circuit device, the method comprising: providing an integrated circuit device workpiece and depositing a ceramic material on the workpiece; the depositing including:
   (a) contacting the workpiece with a manganite precursor obtained by:
      (i) selecting a manganese alkoxide of the formula Mn(OR).sub.2 and at least one metal alkoxide selected from the group consisting of Ln(OR).sub.3 and M(OR).sub.2, wherein Ln is La, Ce, Pr, Nd, Pm, Sm, Eu, Gd, Tb, Dy, Ho, Er, Tin, Yb, Lu, or Y M is Ca, Sr, Ba, Cd, or Pb, and R is C.sub.2 to C.sub.6 alkyl, C.sub.3 to C.sub.9 alkoxyalkyl, or C.sub.6 to C.sub.9 aryl;
      (ii) contacting the selected alkoxides with an anhydrous deoxygenated solvent under a dry and inert atmosphere to form a solution; and
      (iii) adding sufficient deoxygenated water to the solution to partially hydrolyze the alkoxides to form a homogeneous manganite precursor containing a partially hydrolyzed sol; and
   (b) heating the workpiece to transform the precursor into a ceramic material.

18. The method of claim 17, wherein Ln is La, Pr, Nd, or Gd.

19. The method of claim 17, wherein the contacting is by spin coating.

20. The method of claim 17, wherein the method additionally comprises hydrolyzing the precursor to form a gel prior to heating.

* * * * *